United States Patent
Brookes et al.

(10) Patent No.: US 11,492,135 B2
(45) Date of Patent: Nov. 8, 2022

(54) POWER ELECTRONICS UNIT

(71) Applicant: ROLLS-ROYCE plc, London (GB)

(72) Inventors: David F Brookes, Derby (GB);
Graham P Bruce, Derby (GB)

(73) Assignee: ROLLS-ROYCE PLC, London (GB)

( * ) Notice: Subject to any disclaimer, the term of this patent is extended or adjusted under 35 U.S.C. 154(b) by 332 days.

(21) Appl. No.: 16/990,097

(22) Filed: Aug. 11, 2020

(65) Prior Publication Data
US 2021/0061486 A1    Mar. 4, 2021

(30) Foreign Application Priority Data

Sep. 2, 2019  (GB) ..................... 1912570

(51) Int. Cl.
*B64D 45/00*  (2006.01)
*B64D 37/32*  (2006.01)
*B64F 5/60*  (2017.01)

(52) U.S. Cl.
CPC ............. *B64D 45/00* (2013.01); *B64D 37/32* (2013.01); *B64F 5/60* (2017.01); *B64D 2045/0085* (2013.01)

(58) Field of Classification Search
CPC .............................. B64D 45/00; B64D 37/32; B64D 2045/0085; B64D 2221/00; G01M 3/3236; G01M 3/3218; G01M 3/3272; G01M 3/02; H05K 5/067; H05K 5/068; H05K 7/209; H02B 13/025; B64F 5/60
See application file for complete search history.

(56) References Cited

U.S. PATENT DOCUMENTS 6,205,846 B1    3/2001  Dupraz et al.
7,434,987 B1 *  10/2008 Gustafson ........... G01M 3/3236
                                                     374/185

(Continued)

FOREIGN PATENT DOCUMENTS

SE    1 400 276 A1    6/2014
WO    2015/150455 A1  10/2015

OTHER PUBLICATIONS

Feb. 2, 2021 Extended Search Report issued in European Patent Application No. 20189582.8.

(Continued)

*Primary Examiner* — Mussa A Shaawat
(74) *Attorney, Agent, or Firm* — Oliff PLC

(57) ABSTRACT

A power electronics unit for an aircraft and a method of determining the integrity of a power electronics unit are provided. The power electronics unit comprises an electric machine controller; a heatsink arranged to conduct heat from the electric machine controller; a housing comprising a sealed internal volume enclosing the electric machine controller and heatsink; a dielectric liquid partially filling the internal volume to cover the electric machine controller; a gas pocket within the internal volume; a pressure sensor arranged to measure a pressure of gas within the gas pocket; a temperature sensor arranged to measure a temperature within the internal volume; and a controller. The controller is configured to receive signals from the pressure sensor and temperature sensor, determine a pressure and temperature from the received signals and provide an output signal dependent on the determined temperature and pressure.

18 Claims, 4 Drawing Sheets

(56) References Cited

U.S. PATENT DOCUMENTS

| | | | |
|---|---|---|---|
| 10,273,017 B2* | 4/2019 | Wright | B64D 45/00 |
| 10,443,529 B2 | 10/2019 | Hill | |
| 11,022,517 B2* | 6/2021 | Maroju | G01M 3/36 |
| 2004/0099048 A1* | 5/2004 | Miura | G01M 3/3236 |
| | | | 73/40 |
| 2006/0179922 A1* | 8/2006 | Sacca | G01M 3/3218 |
| | | | 73/49.2 |
| 2007/0114223 A1* | 5/2007 | Stonestreet, II | B64D 15/12 |
| | | | 219/482 |
| 2011/0153232 A1 | 6/2011 | Ito | |
| 2014/0355212 A1 | 12/2014 | Campbell et al. | |
| 2016/0214726 A1* | 7/2016 | Giamati | G01R 31/54 |
| 2016/0371957 A1* | 12/2016 | Ghaffari | G08B 21/182 |
| 2017/0010178 A1* | 1/2017 | Cho | G01M 3/26 |
| 2017/0022920 A1 | 1/2017 | Hill | |
| 2019/0165408 A1* | 5/2019 | Andryukov | H01M 50/229 |
| 2019/0308511 A1* | 10/2019 | Bindl | B60K 6/46 |
| 2020/0021107 A1* | 1/2020 | Collins | H02H 1/0015 |
| 2020/0191680 A1* | 6/2020 | Cipullo | G01M 3/047 |
| 2020/0239149 A1* | 7/2020 | Rainville | H01M 8/04567 |

OTHER PUBLICATIONS

Search Report of the Intellectual Property Office of the United Kingdom for GB1912570.7 dated Feb. 16, 2020.

* cited by examiner

POWER ELECTRONICS UNIT

CROSS-REFERENCE TO RELATED APPLICATIONS

This specification is based upon and claims the benefit of priority from UK Patent Application Number 1912570.7 filed on 2 Sep. 2019, the entire contents of which are incorporated herein by reference.

TECHNICAL FIELD

The present disclosure concerns a power electronics unit for an aircraft.

BACKGROUND

Aircraft high power electronics assemblies are typically mounted in the airframe within a pressurised environment and tend to operate at voltages lower than that of minimum corona inception, which may be around 300 volts. For operating at higher voltages and powers, for example for driving electric propulsion units, electronics assemblies may require to be hermetically sealed. In practice, such hermetically sealed units may gradually leak over time over multiple flights due to temperature and pressure changes. This problem is potentially exacerbated by mounting such units in positions within the airframe that are inaccessible and/or in a non-pressurised environment.

Power electronics for controlling operation of hybrid engines, for example, may be required to be located proximate or within the engine in an environment that may be both relatively inaccessible and unpressurised. Preventing corona discharge by preventing, or at least detecting, any leaks for such high-power electronics units would therefore be desirable.

SUMMARY

According to a first aspect there is provided a power electronics unit for an aircraft, comprising:
an electric machine controller;
a heatsink arranged to conduct heat from the electric machine controller;
a housing comprising a sealed internal volume enclosing the electric machine controller and heatsink;
a dielectric liquid partially filling the internal volume to cover the electric machine controller;
a gas pocket within the internal volume;
a pressure sensor configured to measure a pressure of gas within the gas pocket;
a temperature sensor arranged to measure a temperature within the internal volume; and
a controller configured to receive signals from the pressure sensor and temperature sensor, determine a pressure and temperature from the received signals and provide an output dependent on the determined temperature and pressure.

By providing a gas pocket between the dielectric liquid and the upper internal surface of the housing, the power electronics unit can be more resilient to changes in temperature and external pressure, as the compressibility of the gas pocket will allow dielectric liquid to expand and contract without putting excessive pressure on the housing that may otherwise compromise seals over time. Providing an output dependent on pressure and temperature enables an indication of integrity of the unit to be made so that if any leak does develop it can be detected by a change the pressure or temperature beyond what would be expected in the absence of a leak.

The controller may be configured to provide an output signal indicating a leakage of the dielectric liquid if the determined pressure or temperature deviates from a pre-calculated value.

The controller may compare the determined pressure with a calculated pressure for the determined temperature and provide the output signal if the determined pressure is less than the calculated pressure by more than a threshold, which may for example be around 5 percent, 10 percent or 20 percent. Alternatively, the controller may be configured to compare the determined temperature with a calculated temperature for the determined pressure and provide the output signal if the determined temperature is greater than the calculated temperature by more than a threshold, which may for example be around 10, 20 or 30 degrees Celsius.

The gas pocket may be defined between the dielectric liquid and an upper internal surface of the housing or may be positioned elsewhere within the internal volume.

The housing may comprise an upper cover portion and a lower cover portion sealed against a bottom edge of the upper cover portion, the upper cover portion encompassing the electric machine controller and heatsink. This orientation allows the electric machine controller to be covered by the dielectric liquid for optimal insulation and thermal properties.

A sealing ring sealing the lower cover portion against the bottom edge of the upper cover portion may be provided. Providing a seal at the bottom edge allows the seal to be against the dielectric liquid, which is less likely to leak.

The gas pocket may be contained by a flexible diaphragm separating the dielectric liquid from the gas pocket. The flexible diaphragm allows the gas pocket to expand and contract along with changes in pressure and temperature of the internal volume of the housing. The flexible diaphragm may in some examples be sealed against the upper cover portion of the housing. In other examples the flexible diaphragm may form a sealed bladder containing the air pocket.

The temperature sensor may be arranged to measure a temperature of the dielectric liquid. The temperature of the liquid will tend to be more stable than the temperature of the gas pocket, so will provide a more stable reading.

According to a second aspect there is provided a method of determining an integrity of the power electronics unit according to the first aspect, the method comprising:
determining a pressure within the gas pocket from a signal obtained from the pressure sensor;
determining a temperature from a signal obtained from the temperature sensor; and
providing an output signal dependent on the determined temperature and pressure.

The output signal may indicate a leakage of dielectric liquid if the temperature or pressure deviates from a pre-calculated value by more than a predetermined amount.

According to the ideal gas law, pV=nRT, where p is pressure (in Pa), V is volume (in cubic metres), n is the number of moles of gas, R is the ideal gas law constant (in joules per kelvin per mole), and T is absolute temperature (in kelvin). With the unit sealed against leakage of the dielectric liquid, the volume of the gas pocket will vary according to the thermal properties of the relatively incompressible dielectric liquid, which will also tend to have a lower thermal expansion coefficient than that of the gas within the gas pocket. If the volume of the gas pocket increases beyond what is expected at any given temperature, which may be indicated by a lower than expected pressure, this will tend to indicate a leak of dielectric liquid.

The skilled person will appreciate that, except where mutually exclusive, a feature described in relation to any one of the above aspects may be applied mutatis mutandis to any other aspect. Furthermore, except where mutually exclusive, any feature described herein may be applied to any aspect and/or combined with any other feature described herein.

BRIEF DESCRIPTION OF THE DRAWINGS

Embodiments will now be described by way of example only with reference to the accompanying drawings, which are purely schematic and not to scale, and in which.

DETAILED DESCRIPTION

Figure 1:
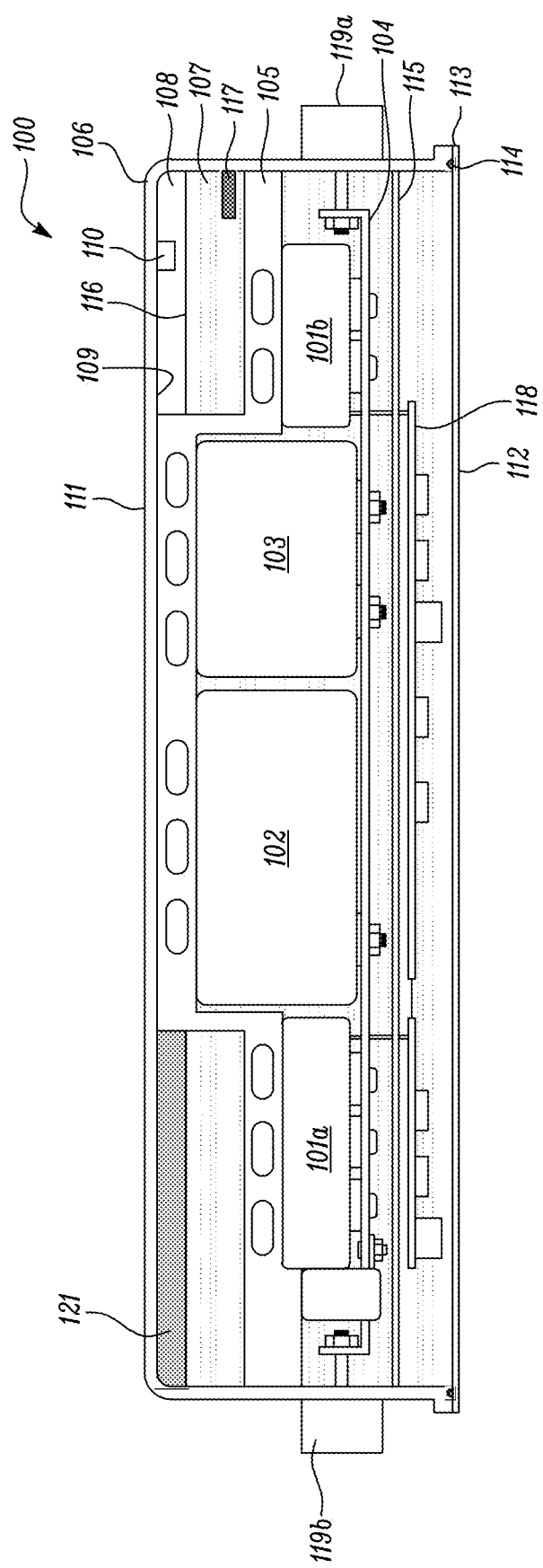
FIG. 1 is a schematic cross-sectional diagram of an example hermetically sealed power electronics unit.

FIG. 1 illustrates an example power electronics unit 100 for an aircraft, the unit 100 containing an electric machine controller, which may be a controller for an electric motor or an electric generator. The electric machine controller may for example be a motor controller for driving an electric propulsion unit for the aircraft. The electric machine controller comprises power semiconductor modules 101a, 101b, a set of DC link capacitors 102 and an output filter 103, all of which are mounted to a bus bar 104. A control and monitoring PCB 118 is separated from the bus bar 104 by a perforated EMC screen 115. A heatsink 105, attached to an upper surface of the electric machine controller, is arranged to conduct heat away from the electric machine controller. The electric machine controller and heatsink 105 are enclosed within a sealed internal volume of a housing 105, which comprises an upper cover portion 111 and a lower cover portion 112. The lower cover portion 112 is sealed against a bottom edge 113 of the upper cover portion 111, and the upper cover portion encompasses the electric machine controller and heatsink 105.

A sealing ring 114 extends around the bottom edge 113 of the upper housing, providing a seal between the lower cover portion 112 and the bottom edge 113 of the upper cover portion 111.

The internal volume of the housing 106 is flooded with a dielectric liquid 107, which covers the electric machine controller and at least partially covers the heatsink 105. A portion of the internal volume is filled with a gas pocket 108, which is defined between the dielectric liquid 107 and an upper internal surface 109 of the housing 106. The gas pocket 108 may be defined by a flexible diaphragm 116 separating the dielectric liquid from the gas pocket 108. In the example shown in FIG. 1, the diaphragm 116 is sealed against the upper cover portion 109 of the housing 106. In alternative embodiments the gas pocket 108 may be provided in other locations around the internal volume of the housing, for example at the side or bottom of the housing. The flexible diaphragm 116 may form a sealed bladder enclosing the gas pocket 108 within the internal volume or may seal off a portion of the internal volume against an internal surface.

A pressure sensor 110 is arranged and configured to measure a pressure of gas within the gas pocket 108. A temperature sensor 117 is also provided to measure a temperature within the internal volume. The temperature sensor 117 may be positioned within the dielectric liquid 107 or may in some embodiments be positioned in the gas pocket 108. Positioning the temperature sensor 117 within the dielectric liquid will tend to result in a more stable reading of temperature, which will rapidly equalise with the temperature of the gas within the gas pocket 108. Signals from the pressure sensor 110 and temperature sensor 117 may be received by sensing modules on the control and monitoring PCB, or controller, 118.

The gas pocket 108 may be filled with air or alternatively with a gas such as nitrogen.

Sealed connectors or terminal blocks 119a, 119b on the unit 100 are provided to connect the unit 100 to a power source and to an electrical machine, as well as to provide control signal connections for driving the controller 118 and for outputting diagnostic and other signals from the controller 118.

One or more further gas pockets 121 may be provided to allow for further resilience to expansion and contraction of the dielectric liquid over an operating temperature range.

Figure 2:
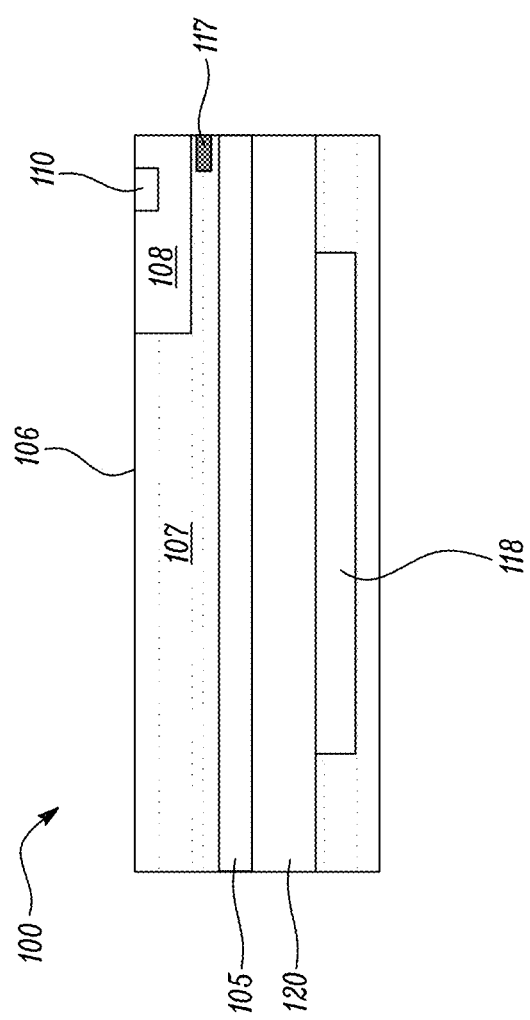
FIG. 2 is a schematic diagram of a power electronics unit connected to a controller for monitoring pressure and temperature and providing an alarm signal.

A simplified schematic drawing of the power electronics unit 100 is shown in FIG. 2. The controller 118 controls operation of the electric machine controller 120 and receives signals from the pressure sensor 110 and temperature sensor 117. The controller 118 determines a pressure within the gas pocket 108 from the pressure sensor signal and a temperature of the internal volume of the unit 100 from the temperature sensor signal. The controller 118 outputs a signal dependent on a ratio of the temperature and pressure. The signal output by the controller 118 may for example be provided to an aircraft engine management system to provide an indication of the integrity of the unit 100. The signal may be a simple binary signal indicating positive or negative integrity dependent on the ratio, or may be a signal indicating a calculated value, for example a volume V determined from the ideal gas law, given prior knowledge of the amount of gas present in the gas pocket, or a calculated amount of leakage based on the determined pressure and temperature.

Determination of the pressure and temperature may be carried out by the controller 118 within the unit 100 or may in alternative examples be carried out by a controller external to the unit 100.

Figure 3:
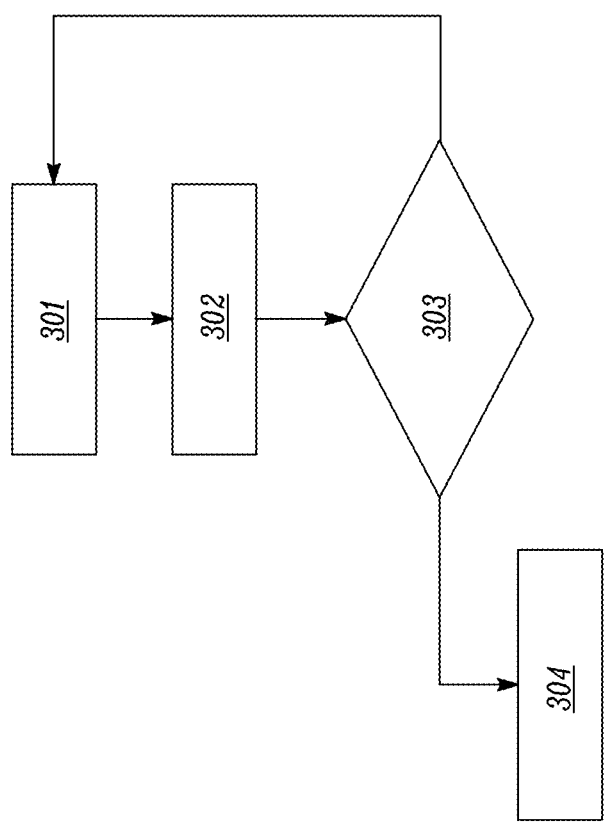
FIG. 3 is a schematic flow diagram illustrating an example method of detecting leakage of dielectric liquid from a power electronics unit of the type shown in FIGS. 1 and 2.

FIG. 3 illustrates schematically a method of determining integrity of a power electronics unit of the type described herein. In a first step 301, the controller 118 determines a pressure within the gas pocket 108 from a signal obtained from the pressure sensor 110 and determines a temperature from a signal obtained from the temperature sensor 117. In a second step 302, the controller 118 compares the pressure and temperature to nominal values, for example by determining what the pressure should be for the measured temperature or by determining what the temperature should be for the measured pressure. If, at step 303, the pressure and temperature are within an expected range, the method returns to step 301 and continues monitoring the temperature and pressure. If, however, the pressure and temperature lie outside of the expected range the method proceeds to step 304 and an output signal, for example an alarm signal, is provided indicating that the integrity of the unit 100 is compromised, which may indicate that the dielectric liquid 107 has leaked.

Figure 4:
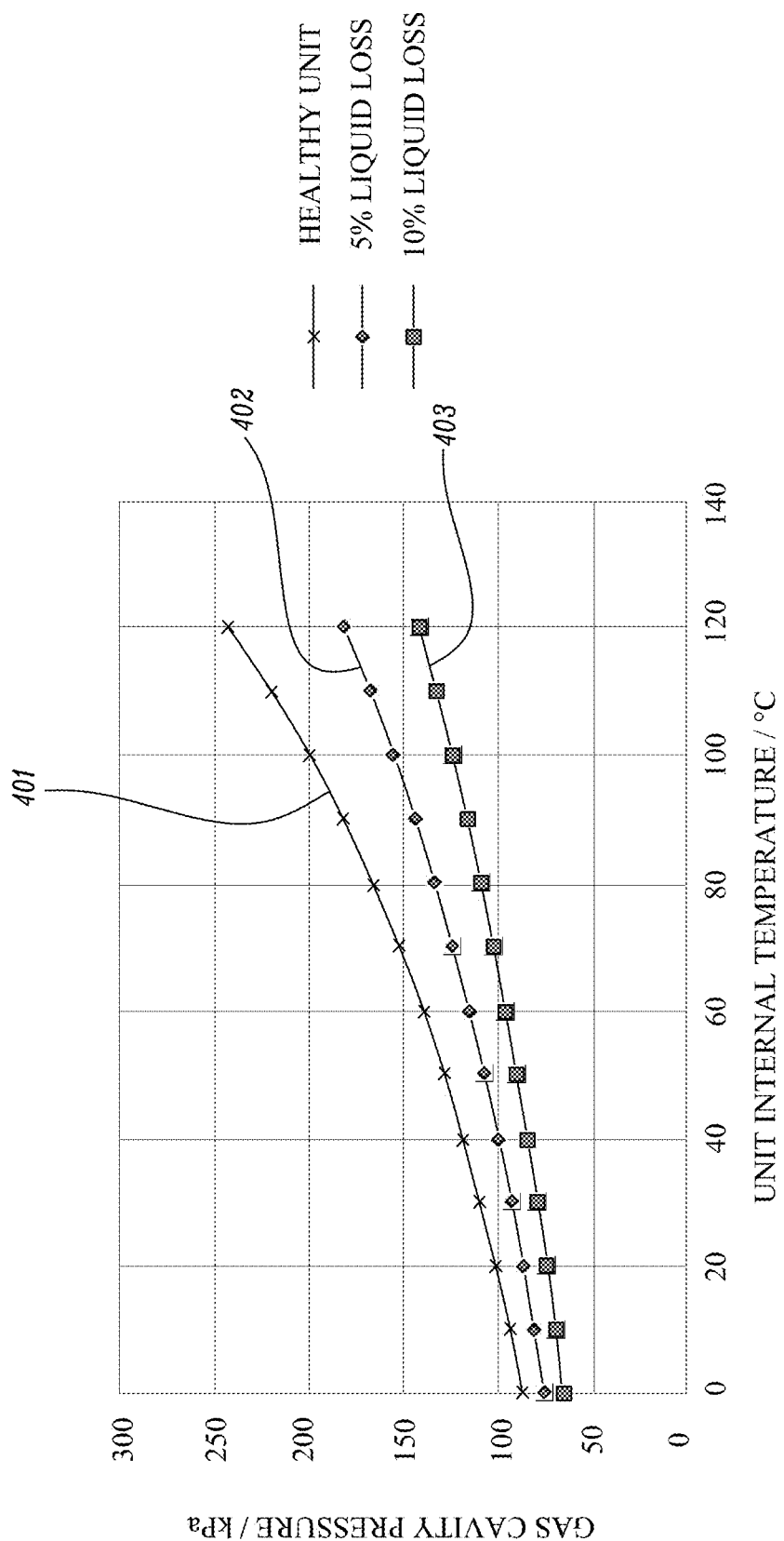
FIG. 4 is a plot of pressure as a function of temperature for an example unit with a gas volume, showing variation in pressure over temperature with different levels of dielectric liquid present.

FIG. 4 illustrates an example plot of pressure as a function of temperature for an example unit containing dielectric liquid and a gas pocket. In this example, the total volume of liquid and gas is 6 litres within a unit having a total internal volume of 40 litres, with 4.8 litres of liquid and 1.2 litres of gas at 20 degrees Celsius at normal atmospheric pressure (101 kilopascals). In this example, the dielectric liquid is Novec® 7700 (available from the 3M Company of Maplewood, Minn., USA), which has a thermal expansion coefficient of around 0.11 percent per kelvin, and the gas is air. Over a given temperature range, the required volume of gas may be determined by the amount the liquid will expand over the temperature range and the maximum pressure the sealed unit is designed to withstand. The volume of gas will need to be greater than the difference in volume that the liquid will take up over this temperature range, and may for example be chosen to be over twice this difference in volume, while still allowing the liquid to cover the components in the unit that require cooling and protection from electrical discharge.

As the temperature increases from 20 degrees Celsius, the dielectric liquid expands and the pressure in the gas volume increases, in line with the thermal expansion coefficient of the dielectric liquid and the ideal gas law. This can be calculated to follow the curve 401 shown in FIG. 4, where the pressure in the gas volume rises from 1 atmosphere (101 kilopascals) at 20 degrees Celsius to over 2 atmospheres (243 kilopascals) at 120 degrees Celsius. The controller may therefore be configured to calculate, or look up, this ideal pressure for a measured temperature and compare this calculated pressure with the measured pressure. If the measured pressure is less than the calculated pressure by more than a threshold amount, for example more than around 5 percent, 10 percent or 20 percent less, an output signal may be triggered to indicate a leak has occurred. The calculation may alternatively be arranged such that the measured pressure is used to calculate, or look up, a temperature that the gas volume should be at, and this can be compared to the measured temperature. If the measured temperature is higher than the calculated temperature by more than a threshold amount, for example by over around 10, 20 or 30 degrees Celsius, the output signal may be triggered to indicate a leak. The controller may perform the calculations of may instead use a look-up table that provides pre-calculated values for pressure and/or temperature to compare with a measured pressure and/or temperature.

Additional curves 402, 403 in FIG. 4 show how the pressure varies with temperature for instances where there is a loss of 5 percent and 1 percent respectively of the dielectric liquid. For a 5 percent loss of liquid, the measured pressure at a temperature of 120 degrees Celsius is around 60 kilopascals less than that without loss of liquid, which should be readily detectable in practice. The measured pressure may for example be compared to the calculated pressure and an output signal provided if the measured pressure is less than the calculated pressure by greater than 5 percent, 10 percent or 20 percent. The threshold value for triggering an alarm signal may be set to allow for thermal fluctuations within the unit to average out, since the measured temperature will not be entirely uniform throughout the unit. For example, if it is known that the temperature within the unit may vary by around ±10 degrees Celsius, the pressure threshold may be selected according to the worst case, which would be towards the higher temperature end of the calculated range. An error of 10 degrees Celsius at the higher temperature end will correspond roughly to an error of around 10 percent in pressure, so the pressure threshold may be set higher than this to avoid an incorrect alarm signal being triggered.

It will be understood that the invention is not limited to the embodiments above-described and various modifications and improvements can be made without departing from the concepts herein. Except where mutually exclusive, any of the features may be employed separately or in combination with any other features and the disclosure extends to and includes all combinations and sub-combinations of one or more features described herein.

Various examples have been described, each of which feature various combinations of features. It will be appreciated by those skilled in the art that, except where clearly mutually exclusive, any of the features may be employed separately or in combination with any other features and the invention extends to and includes all combinations and sub-combinations of one or more features described herein.

The invention claimed is:

1. A power electronics unit for an aircraft, comprising:
   an electric machine controller;
   a heatsink arranged to conduct heat from the electric machine controller;
   a housing comprising a sealed internal volume enclosing the electric machine controller and heatsink;
   a dielectric liquid partially filling the internal volume to cover the electric machine controller;
   a gas pocket within the internal volume;
   a pressure sensor arranged to measure a pressure of gas within the gas pocket;
   a temperature sensor arranged to measure a temperature within the internal volume; and
   a controller configured to receive signals from the pressure sensor and temperature sensor, determine a pressure and temperature from the received signals and provide an output signal dependent on the determined temperature and pressure.

2. The power electronics unit of claim 1 wherein the controller is configured to provide an output signal indicating a leakage of the dielectric liquid if the determined pressure or temperature deviates from a pre-calculated value.

3. The power electronics unit of claim 2 wherein the controller is configured to compare the determined pressure with a calculated pressure for the determined temperature and provide the output signal if the determined pressure is less than the calculated pressure by more than a threshold.

4. The power electronics unit of claim 3 wherein the threshold is around 5 percent, 10 percent or 20 percent.

5. The power electronics unit of claim 2 wherein the controller is configured to compare the determined temperature with a calculated temperature for the determined pressure and provide the output signal if the determined temperature is greater than the calculated temperature by more than a threshold.

6. The power electronics unit of claim 5 wherein the threshold is around 10, 20 or 30 degrees Celsius.

7. The power electronics unit of claim 1 wherein the gas pocket is defined between the dielectric liquid and an upper internal surface of the housing.

8. The power electronics unit of claim 1 wherein the housing comprises an upper cover portion and a lower cover portion sealed against a bottom edge of the upper cover portion, the upper cover portion encompassing the electric machine controller and heatsink.

9. The power electronics unit of claim 8 comprising a sealing ring sealing the lower cover portion against the bottom edge of the upper cover portion.

10. The power electronics unit of claim 1 wherein the gas pocket is contained by a flexible diaphragm separating the dielectric liquid from the gas pocket.

11. The power electronics unit of claim 10 wherein the flexible diaphragm is sealed against the upper cover portion of the housing.

12. The power electronics unit of claim 1 wherein the temperature sensor is arranged to measure a temperature of the dielectric liquid.

13. A method of determining an integrity of the power electronics unit according to claim 1, the method comprising:
   determining a pressure within the gas pocket from a signal obtained from the pressure sensor;
   determining a temperature from a signal obtained from the temperature sensor; and
   providing an output signal dependent on the determined temperature and pressure.

14. The method of claim 13 wherein the output signal is provided indicating a leakage of the dielectric liquid if the pressure or temperature deviates from a pre-calculated value by more than a predetermined amount.

15. The method of claim 14 comprising comparing the determined pressure with a calculated pressure for the determined temperature and providing the output signal if the determined pressure is less than the calculated pressure by more than a threshold.

16. The method of claim 15 wherein the threshold is around 5 percent, 10 percent or 20 percent.

17. The method of claim 14 comprising comparing the determined temperature with a calculated temperature for the determined pressure and providing the output signal if the determined temperature is greater than the calculated temperature by more than a threshold.

18. The method of claim 17 wherein the threshold is around 10, 20 or 30 degrees Celsius.

* * * * *